United States Patent
Freund et al.

(10) Patent No.: US 6,555,413 B1
(45) Date of Patent: Apr. 29, 2003

(54) METHOD FOR INTERCONNECTING SEMICONDUCTOR ELEMENTS TO FORM A THERMOELECTRIC COOLER AND A THERMOELECTRIC COOLER FORMED THEREFROM

(75) Inventors: Joseph M. Freund, Fogelsville, PA (US); George J. Przybylek, Douglasville, PA (US); Mindaugas F. Dautartas, Blacksburg, VA (US)

(73) Assignees: TriQuint Technology Holding Co., Hillsboro, OR (US); Agere Systems, Inc., Allentown, PA (US)

( * ) Notice: Subject to any disclaimer, the term of this patent is extended or adjusted under 35 U.S.C. 154(b) by 0 days.

(21) Appl. No.: 09/790,810

(22) Filed: Feb. 23, 2001

(51) Int. Cl.[7] ............................ H01L 21/44; H01L 21/00
(52) U.S. Cl. ............................ 438/106; 438/15; 438/16; 438/51; 438/55; 438/65; 438/99; 438/124; 438/127; 438/642; 257/40; 257/100; 257/432; 257/678; 257/787
(58) Field of Search ........................ 438/15–27, 31–32, 438/51–55, 64–65, 82–99, 102–107, 124–128, 359, 421, 621, 642, 914; 257/40, 42, 100, 432, 678, 787

(56) References Cited

U.S. PATENT DOCUMENTS

| | | | | |
|---|---|---|---|---|
| 5,409,547 A | * | 4/1995 | Watanabe et al. | 136/204 |
| 5,435,734 A | * | 7/1995 | Chow | 439/69 |
| 5,475,317 A | * | 12/1995 | Smith | 324/760 |
| 5,608,568 A | * | 3/1997 | Blodgett et al. | 359/288 |
| 5,651,495 A | * | 7/1997 | Tocher et al. | 228/123.1 |
| 5,712,448 A | * | 1/1998 | Vandersande et al. | 136/203 |
| 5,817,188 A | * | 10/1998 | Yahatz et al. | 136/237 |
| 5,982,013 A | * | 11/1999 | Kishi et al. | 257/467 |
| 6,196,002 B1 | * | 3/2001 | Newman et al. | 62/3.7 |
| 6,282,907 B1 | * | 6/2002 | Ghoshal | 62/3.7 |
| 6,403,387 B1 | * | 9/2002 | Wensel | 438/15 |
| 2002/0011859 A1 | * | 1/2002 | Smith et al. | 324/755 |

FOREIGN PATENT DOCUMENTS

| | | | | |
|---|---|---|---|---|
| JP | 0597106 a1 | * | 10/1992 | F01N/3/28 |
| JP | 0838868 a2 | * | 10/1993 | H01L/35/30 |

\* cited by examiner

Primary Examiner—Matthew Smith
Assistant Examiner—Granvill D Lee
(74) Attorney, Agent, or Firm—Dickstein Shapiro Morin & Oshinsky LLP

(57) ABSTRACT

A method for electrically coupling thermoelectric cooling (TEC) elements together is described. The TEC elements are encased within an encapsulating material, such as epoxy, and a resist layer is laid on either end of the encapsulating material, covering the ends of the TEC elements. The resist layers are selectively developed to open locations in the resist layers in between adjacent elements. Conductive material, such as gold, is sputter deposited into the locations to provide electrical coupling of the elements.

20 Claims, 4 Drawing Sheets

METHOD FOR INTERCONNECTING SEMICONDUCTOR ELEMENTS TO FORM A THERMOELECTRIC COOLER AND A THERMOELECTRIC COOLER FORMED THEREFROM

FIELD OF THE INVENTION

The invention generally relates to the fabrication of semiconductor devices and associated thermoelectric cooling elements.

BACKGROUND

Heat transfer devices, such as thermoelectric coolers (TECs), are used in some high speed semiconductor devices, such as optoelectric semiconductor devices. TECs incorporate discrete elements which are electrically coupled together. These elements are generally formed from fragile materials commonly used in semiconductor fabrication, such as bismuth telluride.

Known methods of electrically coupling the elements to each other include aligning the elements with each other and soldering individual TEC elements in a matrix to a metallized support structure, such as a submount formed of beryllium oxide.

For example, a conventionally fabricated semiconductor device 10, as shown in FIG. 1, includes an optoelectronic device 12 physically situated on and electrically coupled to a thermoelectric cooling (TEC) device 25. The TEC device 25 includes a metallized ceramic plate 14, a plurality of fragile TEC elements 18, and a heat sink 20. Each of the elements 18 is positively-doped at one end and negatively-doped at the opposite end. The elements 18 are electrically coupled to each other through soldered connections 23. The elements 18 are further electrically coupled to the plate 14 and the heat sink 20 via solder balls 22.

The known methods of electrically connecting conventional TEC devices 25, i.e., soldering connections, to semiconductor devices present a disadvantage in that tolerances in the Z-axis direction (FIG. 1) of the semiconductor devices are large, generally no smaller than one mil, or one times ten to the minus three ($1 \times 10^{-3}$) of an inch. Further, the standard deviation between semiconductor devices so manufactured is also large, often resulting in large numbers of a batch of such semiconductor devices failing to meet production standards.

SUMMARY

In one aspect, the invention provides an apparatus with a heat transfer structure that includes a plurality of heat transfer elements each having a positively-doped region and a negatively-doped region, an encapsulating material encapsulating the heat transfer elements in a block, and conductive connectors formed on the encapsulating material and electrically connecting the heat transfer elements together. The apparatus further includes an optoelectronic device electrically connected to the heat transfer structure.

In another aspect, the invention further provides a thermoelectric cooling device including a plurality of heat transfer elements each having a positively-doped region and a negatively-doped region, an encapsulating material encapsulating the heat transfer elements in a block, and conductive connectors electrically connecting the heat transfer elements together, the conductive connectors being formed on the encapsulating material.

In another aspect, the invention also provides a method for fabricating a semiconductor device. The method includes encapsulating a plurality of heat transfer elements within an encapsulating material to form a block of encapsulated heat transfer elements, each element having a positively-doped and a negatively-doped region, providing at least one resist layer covering an end of the heat transfer elements, selectively preparing locations in the resist layer, each of the locations extending to the encapsulating material and between one heat transfer element and an adjacent heat transfer element, and forming conductive material in the locations, wherein the conductive material electrically connects the heat transfer elements together.

These and other advantages and features of the invention will be more readily understood from the following detailed description of the invention which is provided in connection with the accompanying drawings.

DETAILED DESCRIPTION OF PREFERRED EMBODIMENTS

Figure 5:
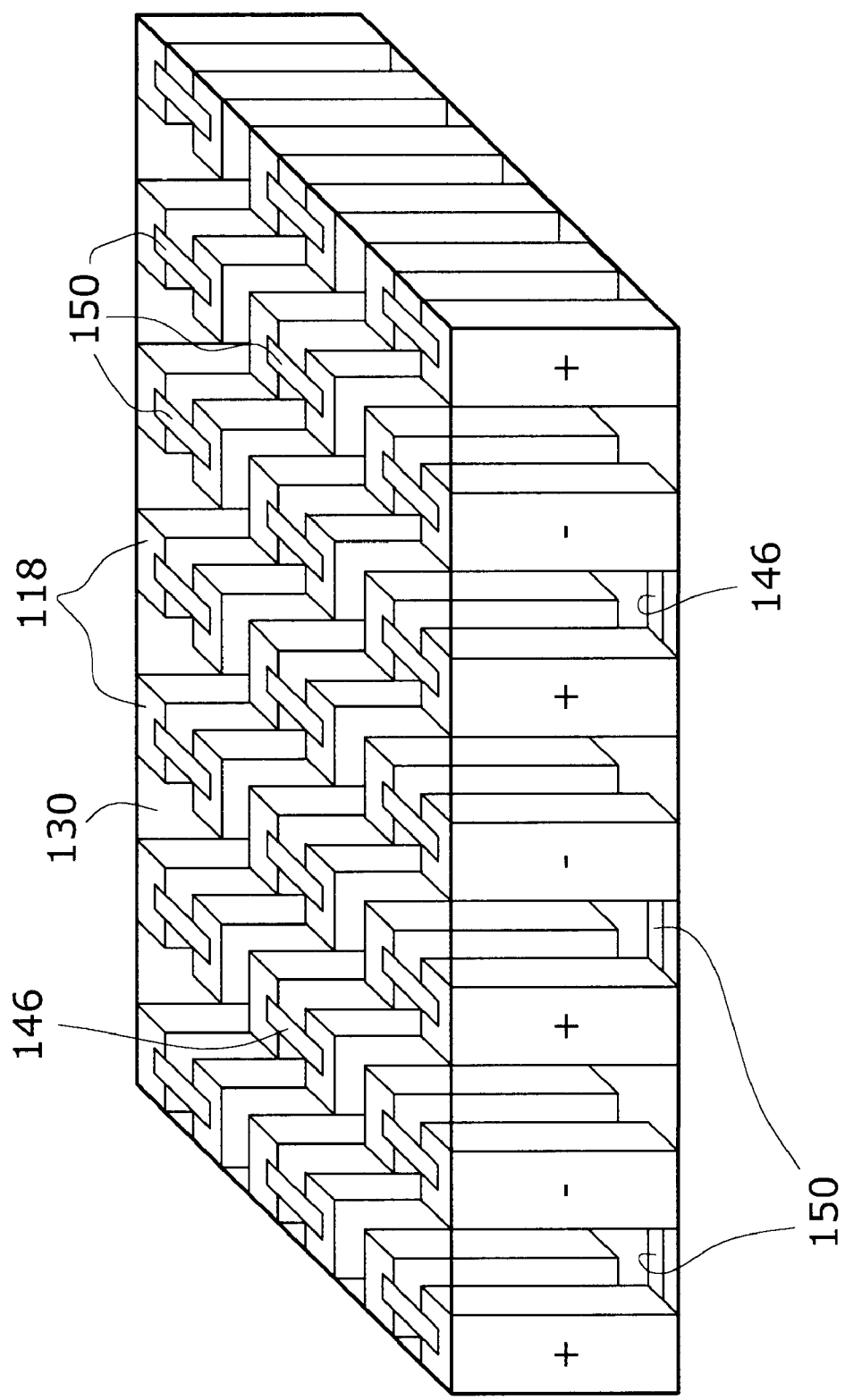
FIG. 5 is a perspective view showing the thermoelectric cooling elements of FIG. 2 electrically coupled together.
Figure 6:
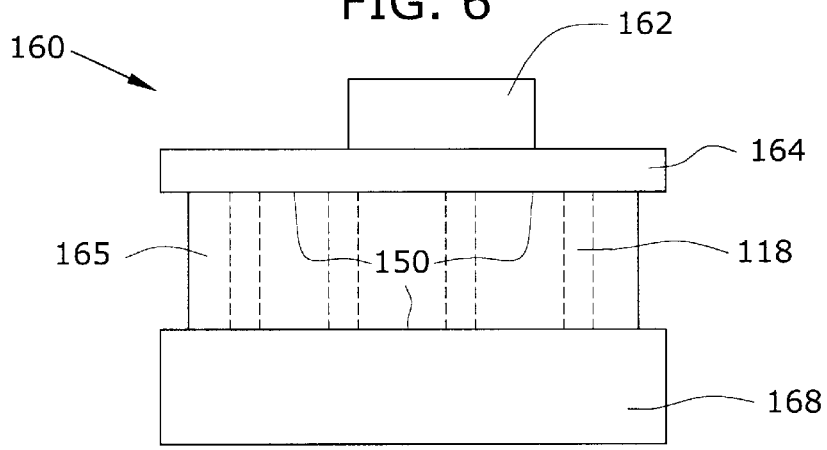
FIG. 6 is a side view of a semiconductor device constructed in accordance with an embodiment of the invention.
Figure 7:
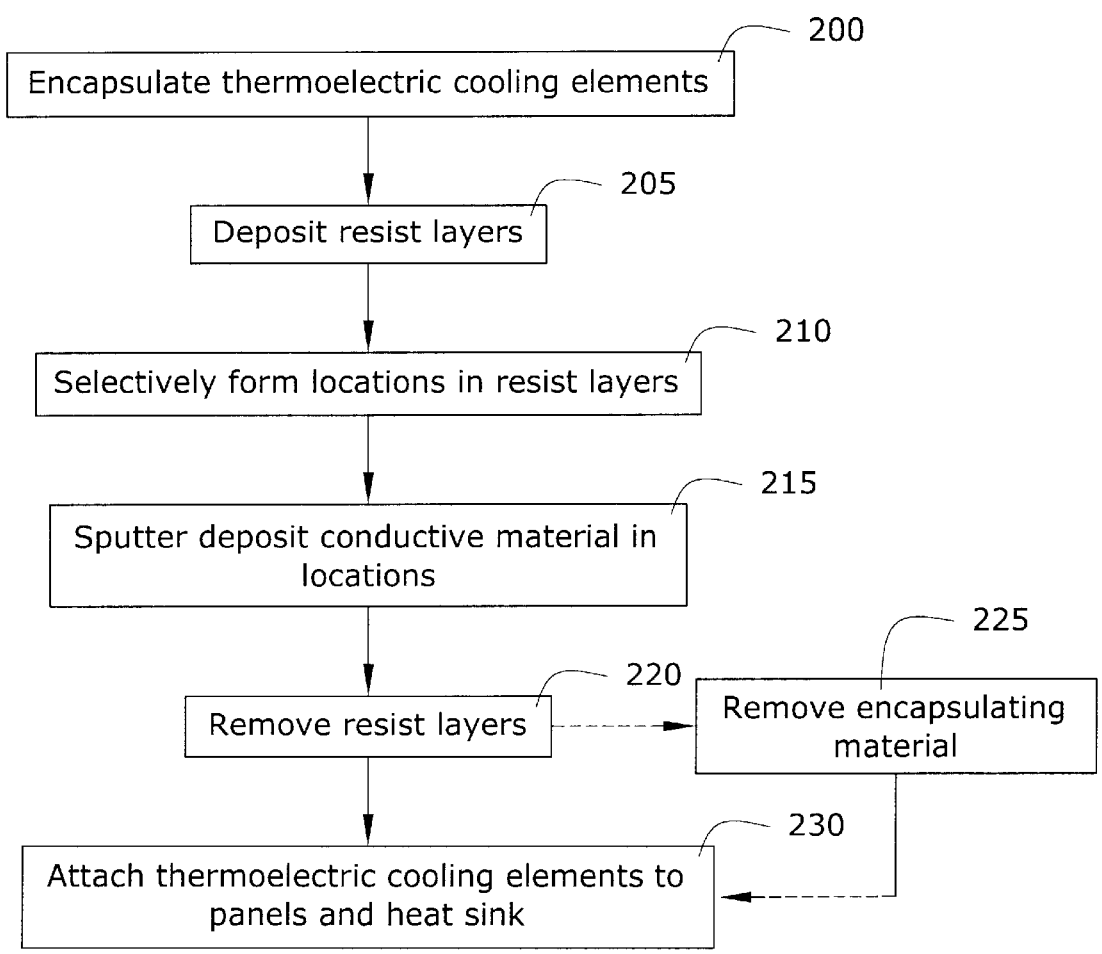
FIG. 7 illustrates process steps for forming a thermoelectric cooling device in accordance with an embodiment of the invention.

FIGS. 2–6 provide various views illustrating the fabrication of a thermoelectric cooling (TEC) device and a semiconductor device utilizing such a TEC device in accordance with an embodiment of the invention. FIG. 7 provides process steps for the fabrication of the TEC device. TEC devices constructed in accordance with an embodiment of the invention reduce the tolerances in the electrical coupling of the individual TEC elements to less than two microns. This reduced tolerance in turn lessens the size of, and diminishes the standard deviation the semiconductor devices utilizing such a TEC device in the Z direction, thereby saving in fabrication costs.

Figure 1:
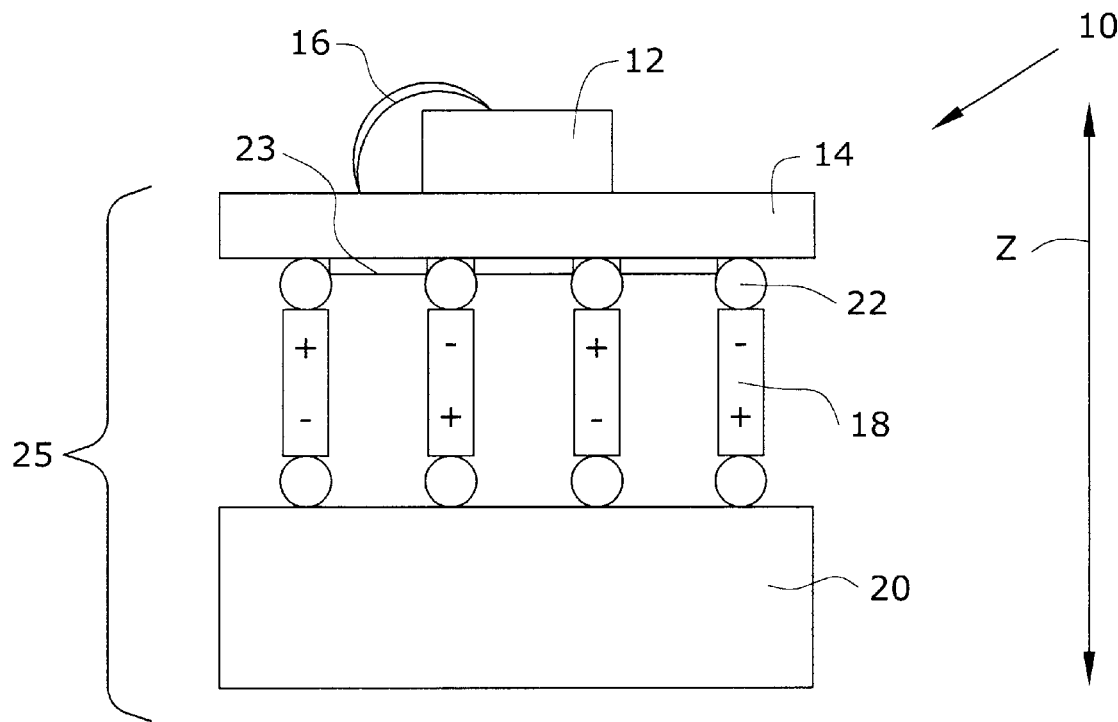
FIG. 1 is a side view of a conventionally fabricated semiconductor device including a thermoelectric cooler device.
Figure 2:
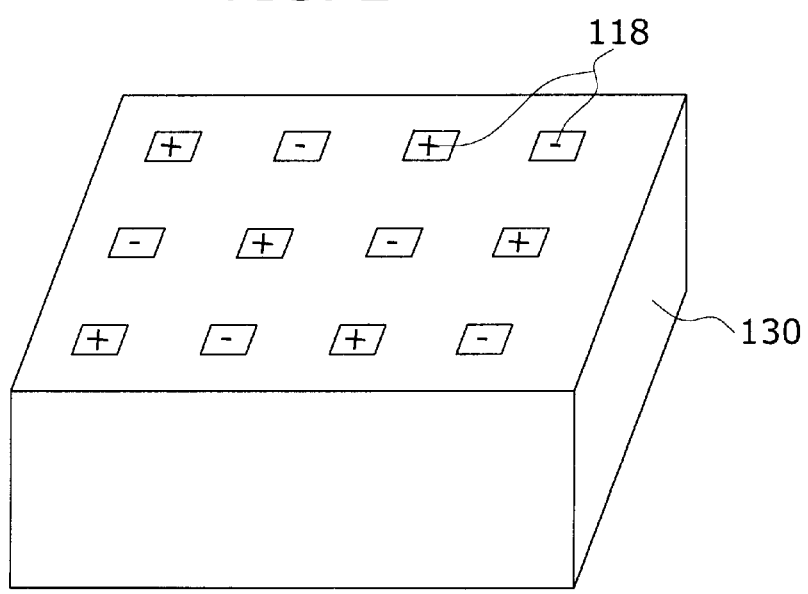
FIG. 2 is a perspective view showing thermoelectric cooling elements encased within an encapsulating material in accordance with an embodiment of the invention.

With specific reference to FIG. 2, there is shown a plurality of individual TEC elements 118 embedded within an encapsulating material 130. The encapsulating material 130 is preferably a viscous fluidic material which hardens over a short time, either with no outside stimulus or in response to a temperature change or other curing condition. Most preferably, the material 130 is a dielectric material such as epoxy, or an elastomer such as rubber. The encapsulating material 130 extends between the opposite ends of the TEC elements 118 such that the encapsulating material 130 is generally flush with the ends of the TEC elements 118. Specifically, the encapsulating material 130 may be even with the ends of the TEC elements 118 or it may be offset to one or both of the ends of the TEC elements 118.

Preferably, the TEC elements 118 are initially securely held in a constant position relative to one another by, for example, an adhesive material. For example, the adhesive material may be mounted upon a hoop or other supporting structure and then may contact one of the ends of the TEC elements 118. Once securely held in constant position relative to one another, the TEC elements 118 are encapsulated by the encapsulating material 130 at an initial step 200 (FIG. 7).

Prior to electrically coupling the TEC elements 118, the ends of the TEC elements 118 may be smoothed by a lapping machine or with another device capable of smoothing fragile elements formed of, for example, bismuth telluride.

Figure 3:
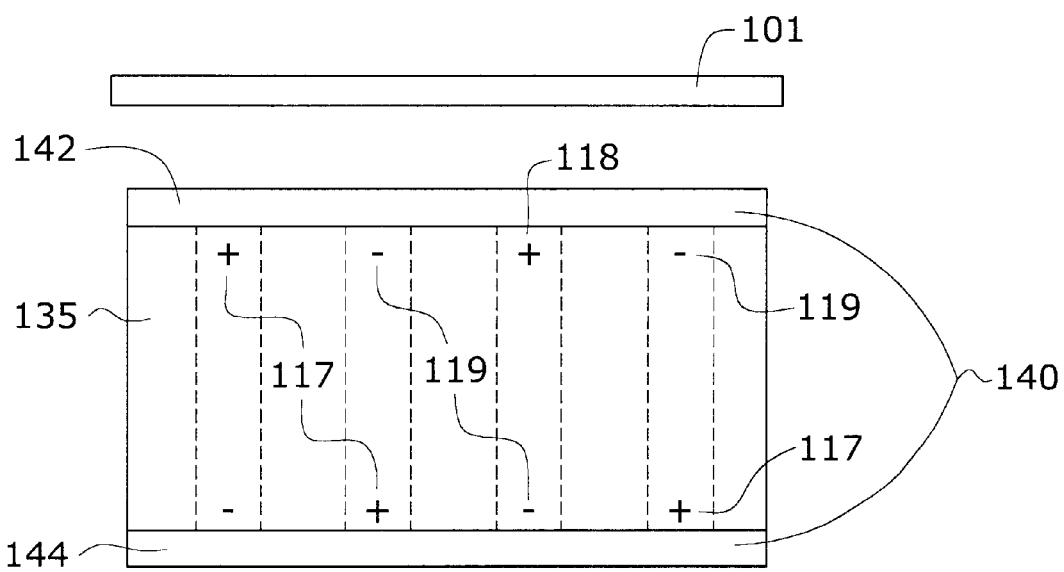
FIG. 3 is a side view of the encased elements of FIG. 2 being patterned in accordance with an embodiment of the invention.
Figure 4:
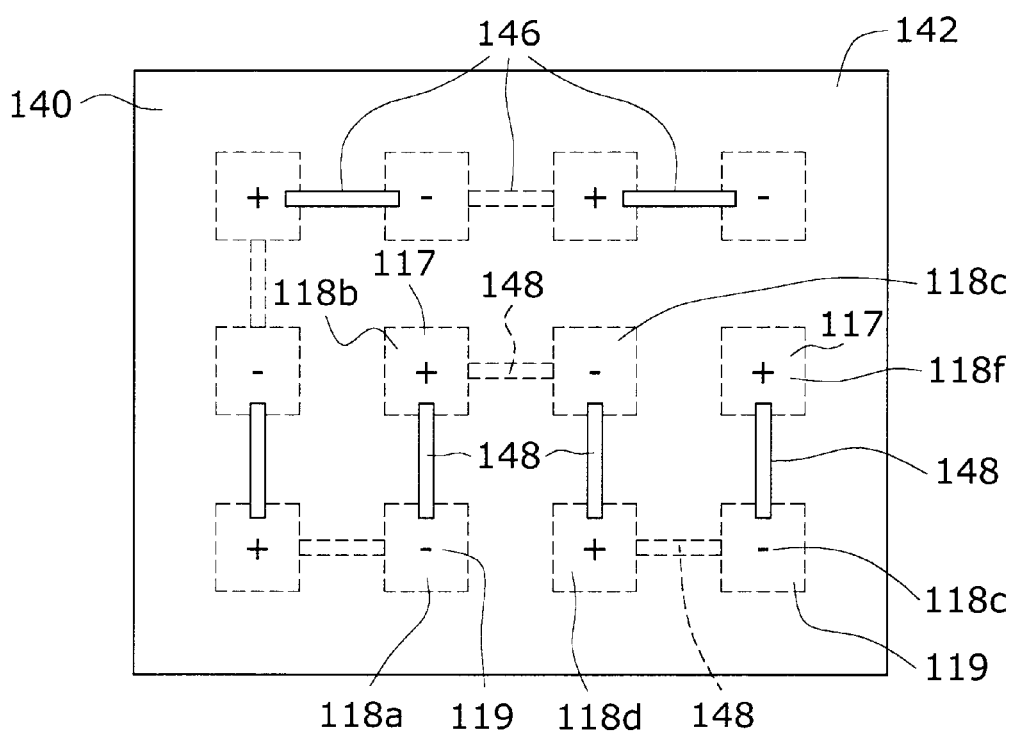
FIG. 4 is a top view of resist material etched in a pattern in accordance with an embodiment of the invention.

Referring specifically to FIG. 3, a resist material 140 is then deposited in layers 142, 144 over the opposite ends of the TEC elements 118 and the encapsulating material 130 to form a block 135 at a step 205 (FIG. 7). As illustrated, some TEC elements 118 have a positively-doped region 117 closest to the resist layer 142 and a negatively-doped region 119 closest to the resist layer 144 and are adjacent to TEC elements 118 having the negatively-doped region 119 closest to the resist layer 142 and the positively-doped region 117 closest to the resist layer 144. Then, at a step 210 (FIG. 7), a pattern 146 is formed into the resist material layers 142, 144. The pattern 146 includes a plurality of selectively formed shallow trenches 148 which extend down to and overlap the ends of the TEC elements 118. The trenches 148 may be formed by a method well known in the art, such as by transmitting light through a patterned mask 101 to develop portions of the resist layers 142, 144 which are removed to create the trenches 148.

The pattern 146 of trenches 148 (FIGS. 4–5) efficiently connects the elements 118 serially by connecting the positively-doped region 117 of one TEC element 118 with the negatively-doped region 119 of another TEC element 118. As an example of the pattern 146 illustrated in FIG. 4, a trench 148 is shown in the resist layer 142 between the negatively-doped region 119 of a TEC element 118a and the positively-doped region of a TEC element 118b. A trench 148 is also formed in the resist layer 144 between the TEC element 118b and the negatively-doped region 119 of a TEC element 118c. A further trench 148 is formed in the resist layer 142 between the TEC element 118c and the positively-doped region 117 of a TEC element 118d. An additional trench 148 is formed in the resist layer 144 between the TEC element 118d and the negatively-doped region 119 of a TEC element 118e and another trench 148 is formed in the resist layer 142 between the TEC element 118e and the positively-doped region 117 of a TEC element 118f.

After forming the pattern 142, the block 135 is placed in an evaporator, or similar deposition apparatus at a step 215 (FIG. 7). A conductive material, preferably gold, is deposited onto the resist layers 142, 144, becoming deposited within the trenches 148, creating connectors 150 (FIGS. 5, 6). After the deposition, the remaining resist layers 142, 144 and the overlying gold layer on the resist are removed at a step 220 (FIG. 7), leaving the conductive, e.g. gold, connectors 150 in the pattern 146 extending between TEC elements 118 and supported in part by the encapsulating material 130.

The TEC elements 118 within the encapsulating material 130 are then attached to a submount 164 and electrically coupled to a heat sink 168 (FIG. 6) at a step 230 (FIG. 7), thereby creating the thermoelectric cooling device 165. The coupling of the TEC elements 118 with the submount 164 may be with a non-conductive epoxy, such as the material forming the encapsulating material 130, or it may be by soldering. If soldered, a dielectric material (not shown) is positioned between the TEC elements 118 and the conductive submount 164, and leads extending off from one or more of the connectors 150 are connected to an optoelectronic device 162, such as a transmitter or a receiver, through, for example, ribbon bonds.

FIG. 6 shows a completed semiconductor device 160 which incorporates the thermoelectric cooling device fabricated in accordance with an embodiment of the invention. Specifically, the TEC elements 118, which are encapsulated in the encapsulating material 130 and electrically coupled via the connectors 150 partially supported by the material 130, are electrically connected to the optoelectronic device 162 through the submount 164. Further, The TEC elements 118 are thermally connected directly to the heat sink 168.

The semiconductor device 160 can be made with the tolerances in the Z-axis direction which are considerably smaller than Z-axis tolerances experienced in conventional devices. Specifically, the Z-axis direction tolerances expected for the semiconductor devices 160 are a few microns, or between about $5 \times 10^{-4}$ inches and about $7.6 \times 10^{-4}$ inches, as compared with a generally no smaller than one mil ($1 \times 10^{-3}$ of an inch) tolerance in the Z-axis direction experienced in conventional devices. Additionally, greater reliability in the tolerances in the Z direction are achieved, thereby reducing the number of semiconductor devices discarded for failing to meet production quality standards.

While the foregoing has described in detail exemplary embodiments of the invention, it should be readily understood that the invention is not limited to the disclosed embodiments. Rather the invention can be modified to incorporate any number of variations, alterations, substitutions or equivalent arrangements not heretofore described, but which are commensurate with the spirit and scope of the invention. For example, while the connection of the optoelectronic device 162 with the TEC elements 118 has been described as being through ribbon bonds, some of the metallization of the connectors 150 may be formed along a side of the encapsulating material to allow for connection with the die by, for example, printed wiring. Accordingly, the invention is not to be seen as limited by the foregoing description, but is only limited by the scope of the appended claims.

What is claimed as new and desired to be protected by Letters Patent of the United States is:

1. An apparatus, comprising:
 a heat transfer structure including:
  a plurality of heat transfer elements each having a positively-doped region and a negatively-doped region;
  an encapsulating material encapsulating each said heat transfer element in a block; and
  conductive connectors formed on said encapsulating material and electrically connecting said heat transfer elements together; and
 an optoelectronic device electrically connected to said heat transfer structure.

2. The apparatus of claim 1, wherein said encapsulating material includes trenches into which said conductive connectors are formed.

3. The apparatus of claim 1, wherein said conductive connectors comprise gold.

4. The apparatus of claim 1, wherein all of said heat transfer elements are serially connected.

5. The apparatus of claim 1, wherein said encapsulating material comprises a dielectric material.

6. The apparatus of claim 5, wherein said dielectric material comprises epoxy.

7. The apparatus of claim 5, wherein said dielectric material comprises an elastomer.

8. A thermoelectric cooling device, comprising:
   a plurality of heat transfer elements each having a positively-doped region and a negatively-doped region;
   an encapsulating material interspersed among and encapsulating said heat transfer elements in a block; and
   conductive connectors electrically connecting said heat transfer elements together, said conductive connectors being formed on said encapsulating material.

9. The thermoelectric cooling device of claim 8, wherein said encapsulating material includes trenches into which said conductive connectors are formed.

10. The thermoelectric cooling device of claim 8, wherein said conductive connectors comprise gold.

11. The thermoelectric cooling device of claim 8, wherein said encapsulating material comprises a dielectric material.

12. The thermoelectric cooling device claim 11, wherein said dielectric material comprises epoxy.

13. The thermoelectric cooling device of claim 11, wherein said dielectric material comprises an elastomer.

14. A method for fabricating a semiconductor device, comprising:
   encapsulating each of a plurality of heat transfer elements within an encapsulating material to form a block of encapsulated heat transfer elements, each said element having a positively-doped and a negatively-doped region;
   providing at least one resist layer, said layer covering an end of the heat transfer elements;
   selectively preparing locations in the resist layer, each of the locations extending to the encapsulating material and between one said heat transfer element and an adjacent said heat transfer element; and
   forming conductive material in the locations, wherein the conductive material electrically connects the heat transfer elements together.

15. The method of claim 14, further comprising electrically connecting an optoelectronic device to said heat transfer elements.

16. The method of claim 14, wherein said act of encapsulating is such that the encapsulating material is generally flush with the ends of the elements.

17. The method of claim 14, wherein said act of providing includes providing one resist layer covering one end of the heat transfer elements and a second resist layer covering the other end of the heat transfer elements.

18. The method of claim 17, wherein said act of selectively preparing locations comprises utilizing a patterned mask.

19. The method of claim 17, wherein said act of forming comprises sputter depositing the conductive material onto the encapsulating material.

20. The method of claim 19, further comprising removing any remaining resist layers after said depositing.

* * * * *